United States Patent [19]

Rickenbacker

[11] 4,160,922
[45] Jul. 10, 1979

[54] METHOD OF GENERATING A DIRECT CURRENT CONTROL SIGNAL FROM A NOISY ALTERNATING CURRENT SIGNAL

[75] Inventor: James E. Rickenbacker, Houston, Tex.

[73] Assignee: Exxon Production Research Company, Houston, Tex.

[21] Appl. No.: 821,120

[22] Filed: Aug. 2, 1977

[51] Int. Cl.² .............................................. H03K 5/00
[52] U.S. Cl. .................................... 307/261; 307/353; 328/26; 328/128; 328/151; 324/77 A; 324/111
[58] Field of Search .................. 307/261, 353; 328/26, 328/151, 128; 324/77 A, 111; 363/126, 86

[56] References Cited
U.S. PATENT DOCUMENTS
3,717,818  2/1973  Herbst .............................. 328/151 X Primary Examiner—John Zazworsky
Attorney, Agent, or Firm—E. Eugene Thigpen

[57] ABSTRACT

A DC signal is generated having a amplitude related to the amplitude of an AC signal, with minimal delay and low sensitivity to noise in the AC signal.

2 Claims, 12 Drawing Figures

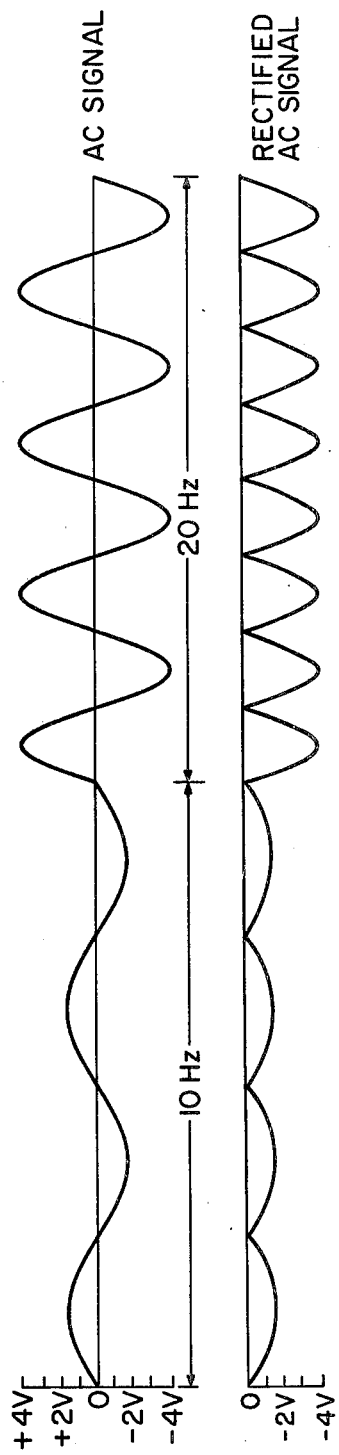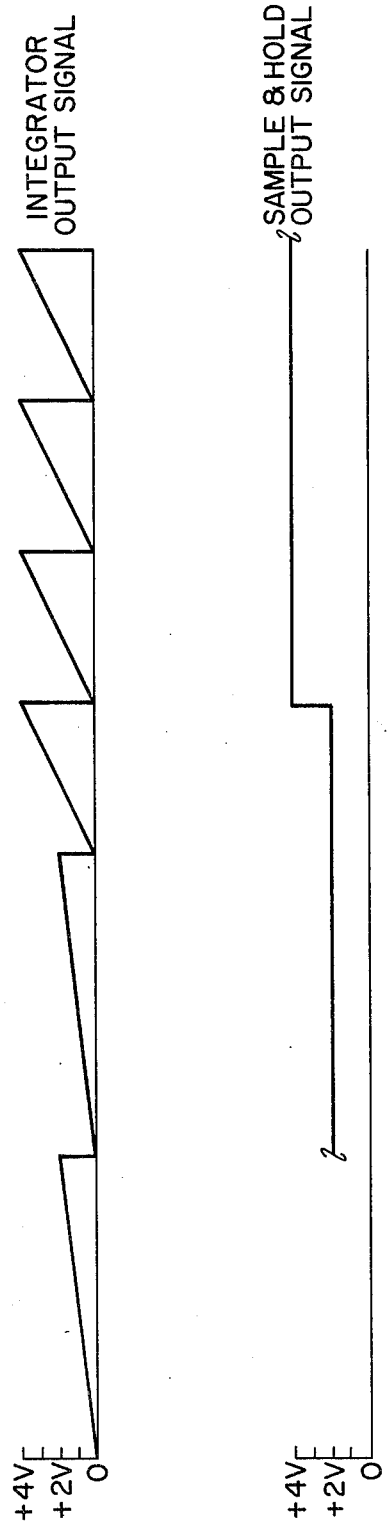
FIG.5A  FIG.5B  FIG.5C  FIG.5D  FIG.5E  FIG.5F

METHOD OF GENERATING A DIRECT CURRENT CONTROL SIGNAL FROM A NOISY ALTERNATING CURRENT SIGNAL

BACKGROUND OF THE INVENTION

1. Field of the Invention

The field of this invention is that of generating a DC signal having an amplitude related to the amplitude of a noisy AC signal.

2. Description of the Prior Art

In constructing feedback control systems it is sometimes necessary to generate a direct current feedback signal that is proportional to an alternating current signal developed by a transducer. One method utilized for generating such a feedback signal has been to full-wave rectify the AC signal and then filter this rectified signal. A disadvantage of this method is that if the signal is filtered sufficiently to smooth the pulsating DC, a long time constant filter must be employed. This generates a long time delay between the AC signal and the signal that is fed back as a control signal. For many applications this delay is unacceptable. Because of the long time constant, however, this method is relatively insensitive to noise or distortion of the AC signal.

A second method that has been used is to full-wave rectify the AC signal and then follow this rectifier with a peak detector. A signal is maintained at the output of the peak detector equal to the peak amplitude of the last half cycle of the alternating current signal. This method has less time delay than the filtered method but it is very sensitive to noise and distortion in the AC signal, since any ripple occurring at the peak of the AC signal will be recognized as signal.

SUMMARY OF THE INVENTION

This invention is a system for generating a DC signal having an amplitude related to the amplitude of an AC signal with minimal delay and low sensitivity to noise present in the AC signal. The circuit comprises a full-wave rectifier, means for integrating the full-wave rectified signal over a selected number of cycles (or half cycles) of the AC input signal, and a sample and hold circuit following the output of the integrator.

In a preferred embodiment, the sample and hold circuit samples the integrator output at the end of a selected number of half cycles of the AC signal. The integrator is then reset and the sample and hold circuit maintains the sampled output level while the integrator integrates a second selected number of cycles of the AC input signal. At the end of the second set of cycles, the output of the integrator is sampled again and this level is applied to the sample and hold output and the integrator again reset. The output signal from the sample and hold is, therefore, a DC representation of the amplitude of the AC input.

BRIEF DESCRIPTION OF THE DRAWINGS

FIGS. 5A–5F show typical waveform in an embodiment of the invention.

DESCRIPTION OF THE PREFERRED EMBODIMENT

Figure 1:
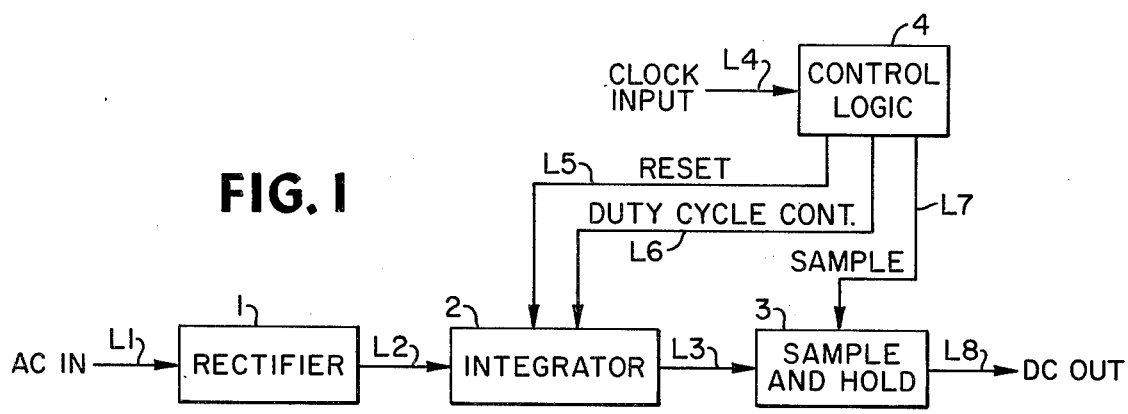
FIG. 1 shows a block diagram of an embodiment of the invention.

FIG. 1 shows a block diagram of an embodiment of the invention. An AC input signal is connected to the input of a full-wave rectifier circuit designated by numeral 1. The rectified output signal from rectifier 1 is applied to integrator 2, whose output is applied to sample and hold circuit 3. Control logic 4 operates in response to a clock input signal to generate control signals for resetting integrator 2 and for transferring the output signal from the integrator to the sample and hold circuit at selected intervals. A more detailed description of the circuits comprising the block diagram shown in FIG. 1 is given below.

Figure 2:
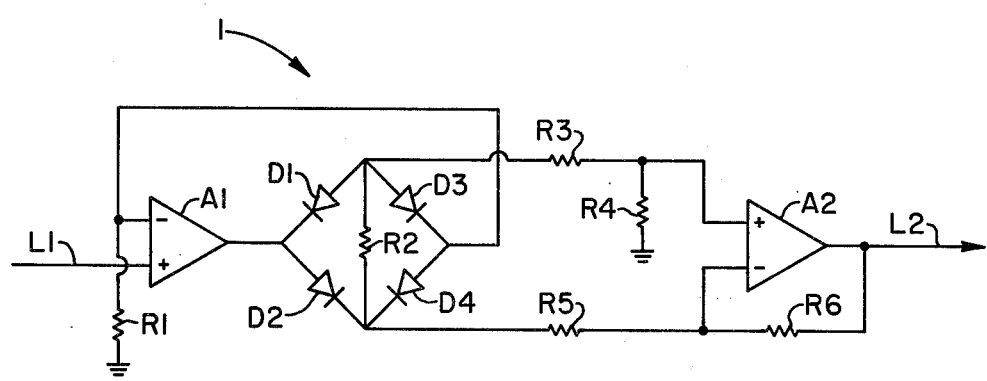
FIG. 2 shows a rectifier schematic.

In rectifier circuit 1, the AC input signal is converted from an alternating input signal such as shown in FIG. 5A to a full-wave rectified signal such as shown in FIG. 5B. As shown in FIG. 2, the AC input signal is connected to the plus (+) terminal of amplifier A1, which may be a Fairchild μA741 operational amplifier. The minus (−) terminal of amplifier A1 is connected to ground through resistor R1, which may be a 1000 ohm resistor. The output terminal of amplifier A1 is connected to a diode bridge comprising diodes D1, D2, D3, and D4, the output of the amplifier being connected to the minus (−) terminal of diode D1 and the plus (+) terminal of diode D2. The plus (+) terminal of diode D3, and one terminal of resistor R2, which may also be a 1000 ohm resistor, and one terminal of resistor R3, which may be a 10,000 ohm resistor, are connected to the plus (+) terminal of diode D1. Connected to the minus (−) terminal of diode D2 is the other terminal of resistor R2, the minus (−) terminal of diode D4, and one terminal of resistor R5, which may also be a 10,000 ohm resistor. The minus (−) terminal of diode D3 is connected to the positive (+) terminal of diode D4 and also to the minus (−) input terminal of amplifier A1. The second terminal of resistor R3 is connected to the plus (+) terminal of amplifier A2 which may also be a Fairchild μA741 operational amplifier, and to resistor R4, which may be a 10,000 ohm resistor. The other terminal of resistor R4 is connected to ground. Resistor R5 is connected to the minus (−) terminal of amplifier A2, and the minus (−) terminal of amplifier A2 is also connected through R6, which may be a 10,000 ohm resistor, to the output thereof.

The precision rectifier functions as follows. When the AC input signal on Line L1 is negative, the output of amplifier A2 on line L2 will be essentially identical to the input signal. When the AC input signal goes positive, the precision rectifier converts this positive signal into a negative signal of substantially equal magnitude. An input signal corresponding to FIG. 5A, for example, after being passed through the precision rectifier circuit, would look like FIG. 5B.

Figure 3A:
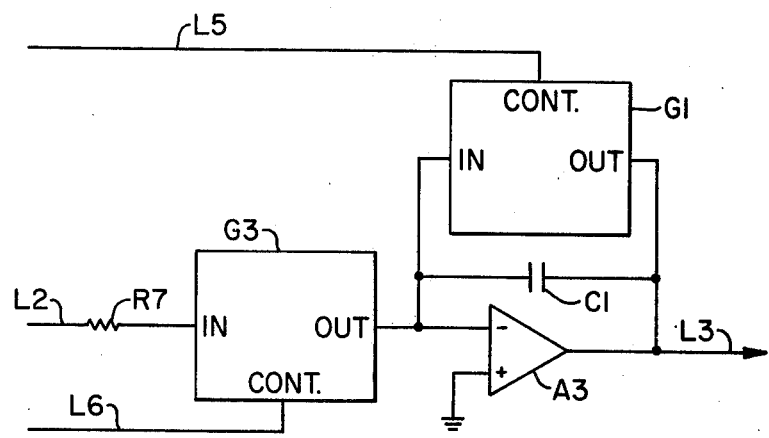
FIG. 3A shows a second embodiment of an integrator circuit.
Figure 3:
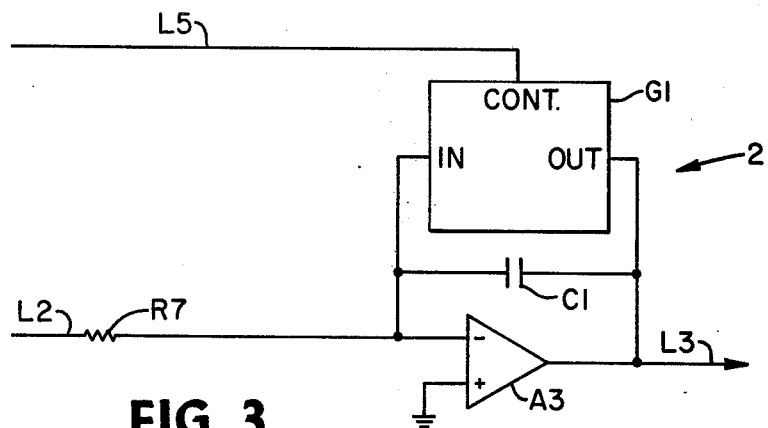
FIG. 3 shows an integrator circuit schematic.

After the input signal is rectified, it is integrated in integrator 2. As shown in FIG. 3, the rectifier output signal is applied to the minus (−) terminal of amplifier A3, which may also be a μA741 device, through resistor R7. Capacitor C1 is connected between the minus (−) terminal of amplifier A3 and the output thereof, and, connected in parallel with capacitor C1 is gate G1 which may be ¼ of an RCA CD4016 Quad Bilateral Switch. The plus (+) terminal of amplifier A3 is connected to ground. Resistor R7 and capacitor C1 may be selected to achieve the desired integrator characteristics. For example, if a longer integration time is desired to achieve greater filtering, capacitor C1 and resistor R7 would be larger in value, and if less filtering and faster response time is desired then C1 and R7 would be made smaller in value. FIG. 5E shows a typical output signal from the integrator, as it might appear when the integrator is reset at the end of each cycle of the AC input signal. Methods for determining appropriate values for resistor R7 and capacitor C1 are known to those of ordinary skill in the art.

Figure 4:
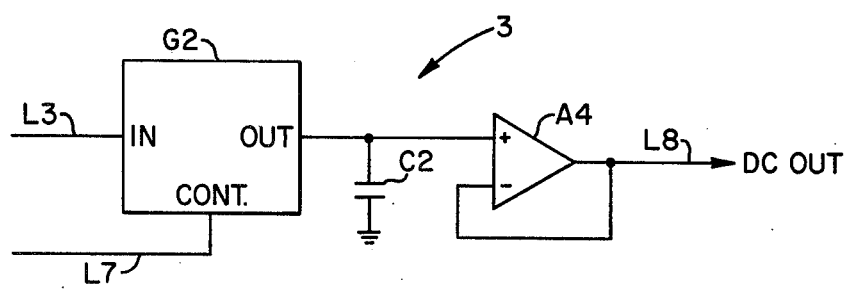
FIG. 4 shows a sample-and-hold circuit schematic.

The output of integrator 2 is applied through line L3 to the input of sample-and-hold circuit 3 shown in FIG. 4. The input is applied through gate G2, which may also be an RCA CD4016 gate device, to the plus (+) input terminal of amplifier A4. The minus (−) terminal of amplifier A4 is connected to the amplifier output, which those of ordinary skill in the art will recognize as a unity gain amplifier configuration. Capacitor C2 is connected between the plus (+) terminal of amplifier A4 and ground. Capacitors C1 and C2 should be low leakage devices, such as polystyrene capacitors.

A Reset signal is applied via line L5 to the control terminal of gate G1. This Reset signal, which will have a waveform such as shown in FIG. 5D, may preferably be generated to be synchronous with the period of the AC input signal to the rectifier circuit. The selected frequency of this Reset signal may vary depending on the filtering and response time characteristics desired. A longer integration time will achieve greater filtering, and result in a slower response time. A shorter integration time yields a faster response time, but less filtering. The Reset signal resets the integrator by creating a short circuit, for a short time interval, across the terminals of capacitors C1. The Reset signal is generated synchronously with, and, preferably, immediately following the Sample signal which is applied to the control terminal of gate G2 via line L7. The Sample signal transfers the output voltage level from the integrator to capacitor C2 and the input of amplifier A4. At the end of the Sample signal, gate G2 again becomes substantially an open circuit leaving capacitor C2 charged to the new voltage level. While gate G2 is nonconducting, the voltage level on capacitor C2 will be maintained at the output of amplifier A4. This voltage level will be maintained at the sample and hold output, until the system completes the next integration sequence and the Sample signal transfers a new voltage level to the sample and hold circuit.

Figure 6:
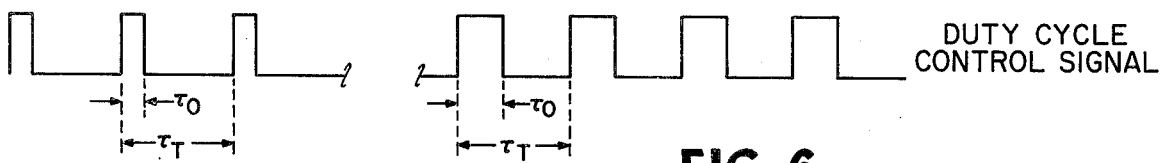
FIG. 6 show typical variations in a duty cycle control signal from the control logic.

If the frequency of the AC input signal to the rectifier varies, it is apparent that the integrator output signal will attain a higher voltage level for a given number of periods of a lower frequency input signal than for a higher frequency signal of the same amplitude. In order to maintain the output signal from the integrator (and sample and hold) proportional to the amplitude of the AC input signal, the circuit shown in FIG. 3A may be used to vary the integration time constant of the integrator. The circuit of FIG. 3A is the same as that of FIG. 3 except that a switching means G3 has been inserted in series with resistor R7. This switching means may also be ¼ of an RCA CD4016 Quad Bilateral Switch. Gate G3 is switched alternately to its conducting and nonconducting states by applying a square wave signal such as illustrated in FIG. 6 to the control terminal thereof. This square wave signal is generated to have a duty cycle which varies in proportion to variations in the frequency of the AC input signal to the rectifier. For a high frequency AC signal, the duty cycle of the square wave signal would be higher than for a low frequency AC input signal. That is, $T_o$, the time during which the square wave signal would cause gate G3 to conduct current would be greater for a higher frequency AC input signal than for a lower frequency AC input signal. This relationship is as follows:

$$T_o/T_T = f/f_{max}$$

where
- $T_o$ = "on" time, during which gate G3 will conduct
- $T_T$ = total period of the variable duty cycle control signal
- $f_{max}$ = maximum frequency of the AC input signal
- $f$ = frequency of the AC input signal For a 10 Hz AC input signal, such as shown on the left side of FIG. 5A, the duty cycle control signal might have the waveform shown on the left side of FIG. 6. For a higher frequency input signal, such as the 20 Hz signal shown on the right side of FIG. 5A, the duty cycle of the duty cycle control signal might be increased as shown on the right side of FIG. 6. By varying the conducting duty cycle of gate G3, the effective resistance of resistor R7 is varied. By varying this effective resistance, the output level attained by the integrator circuits by integrating its input signal for a selected number of cycles can be maintained constant even though the frequency of the AC input signal varies. It should also be apparent to those skilled in the art that the frequency of the square wave control signal should be much higher, on the order of twenty to one, for example, than the maximum frequency of the AC input signal.

The control signals referred to herein as "Reset," "Duty Cycle Control," and "Sample" are generated in the Control Logic. To generate the "Sample" and "Reset" signals synchronously with the periods of the AC input signal, a clock must either be available, or be generated, which is synchronous with the AC input signal. Such a clock typically will be available and is designated as "Clock Input" on FIG. 1. If such a clock is not available it may be generated from the AC input signal by circuits known to those of ordinary skill in the art, such as phase-locked loops, or zero-crossing detectors.

The clock input is utilized to generate the "Reset" and "Sample" signals at selected cycle intervals of the AC input signal. The "Duty Cycle Control" signal will normally have a fixed period, but the "on" time will vary as a function of the AC input signal frequency. Logic Circuits for generating the "Reset," "Sample," and "Duty Cycle Control" signal may be of standard designs known to those of ordinary skill in the art and will not be described herein.

I claim:

1. Apparatus for generating a direct current output signal proportional to the amplitude of an alternating current signal comprising:
   a rectifier, said rectifier being responsive to said alternating current signal for generating a rectified output signal related to said alternating current signal;
   integrator means for integrating the rectified output signal from said rectifier for a selected number of half cycles of said alternating current signal, said integrator means including means responsive to a variable control signal for varying the integrating time constant of said integrator means; and means for sampling the output level of said integrator means and for holding the sampled output level for a selected time.

2. The apparatus of claim 1 wherein said means responsive to a variable control signal for varying the integrating time constant of said integrator means comprises a switching means in series with a resistor, said switching means adapted to being alternately switched to conducting and nonconducting states in response to said control signal to vary the effective value of said resistor.

* * * * *